United States Patent
Zuraski, Jr. et al.

(10) Patent No.: US 7,350,119 B1
(45) Date of Patent: Mar. 25, 2008

(54) COMPRESSED ENCODING FOR REPAIR

(75) Inventors: Gerald D. Zuraski, Jr., Austin, TX (US); Scott A. White, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 550 days.

(21) Appl. No.: 10/859,284

(22) Filed: Jun. 2, 2004

(51) Int. Cl.
G11C 29/00 (2006.01)
G11C 7/00 (2006.01)

(52) U.S. Cl. .................. 714/711; 714/723; 365/201

(58) Field of Classification Search ............... None
See application file for complete search history.

(56) References Cited

U.S. PATENT DOCUMENTS

| | | | |
|---|---|---|---|
| 6,469,932 B2 * | 10/2002 | Roohparvar et al. ... | 365/185.09 |
| 6,560,740 B1 | 5/2003 | Zuraski, Jr. et al. | |
| 6,574,757 B1 * | 6/2003 | Park et al. .................. | 714/710 |
| 6,691,264 B2 * | 2/2004 | Huang ........................ | 714/723 |
| 6,711,056 B2 * | 3/2004 | Abedifard et al. ..... | 365/185.09 |
| 6,847,565 B2 * | 1/2005 | Abedifard et al. .......... | 365/200 |
| 7,200,786 B2 * | 4/2007 | Cheng et al. ............... | 714/733 |
| 7,237,154 B1 * | 6/2007 | Zorian ........................ | 714/711 |

FOREIGN PATENT DOCUMENTS

EP 1447813 A1 * 8/2004

OTHER PUBLICATIONS

"A processor-based built-in self-repair design for embedded memories" by Chin-Lung Su et al. Test Symposium. 2003. ATS 2003. 12th Asian Publication Date: Nov. 16-19, 2003 On pp. 366-371 ISSN: 1081-7735 ISBN: 0-7695-1951-2 INSPEC Accession No. 7905609.*

"Test and repair of large embedded DRAMs. I" by McConnell et al. This paper appears in: Test Conference, 2001. Proceedings. International Publication Date: 2001 On pp. 163-172 Meeting Date: Oct. 30, 2001-Nov. 1, 2001 ISBN: 0-7803-7169-0 INSPEC Accession No. 7231179.*

(Continued)

*Primary Examiner*—Cynthia Britt
(74) *Attorney, Agent, or Firm*—Meyertons Hood Kivlin Kowert & Goetzel, P.C.; Rory D. Rankin

(57) ABSTRACT

A hierarchical encoding format for coding repairs to devices within a computing system. A device, such as a cache memory, is logically partitioned into a plurality of sub-portions. Various portions of the sub-portions are identifiable as different levels of hierarchy of the device. A first sub-portion may corresponds to a particular cache, a second sub-portion may correspond to a particular way of the cache, and so on. The encoding format comprises a series of bits with a first portion corresponding to a first level of the hierarchy, and a second portion of the bits corresponds to a second level of the hierarchy. Each of the first and second portions of bits are preceded by a different valued bit which serves to identify the hierarchy to which the following bits correspond. A sequence of repairs are encoded as string of bits. The bit which follows a complete repair encoding indicates whether a repair to the currently identified cache is indicated or whether a new cache is targeted by the following repair. Therefore, certain repairs may be encoded without respecifying the entire hierarchy.

25 Claims, 9 Drawing Sheets

OTHER PUBLICATIONS

"Test and repair of large embedded DRAMs. 2" by Nelson et al. This paper appears in: Test Conference, 2001. Proceedings. International Publication Date: 2001 On pp. 173-181 Meeting Date: Oct. 30, 2001-Nov. 1, 2001 ISBN: 0-7803-7169-0 INSPEC Accession No. 7211333.*

"Built-In Self-Test and Repair for Embedded SRAMS"; Thesis of Ross Tulloch; Simon Fraser University; Aug. 2002; 53 pgs.

"On-Chip Repair and an ATE Independent Fusing Methodology"; Cowan, et al.; IBM, Essex Junction Vermont; Paper 7.3, pp. 178-186; ITC International Test Conference; 2002 IEEE.

"High-Performance Processor Design Guided by System Costs"; Kubicek, et al.; Hewlett-Packard Journal, Jun. 1997, Article 8; pp. 1-10.

* cited by examiner

COMPRESSED ENCODING FOR REPAIR

BACKGROUND OF THE INVENTION

1. Field of the Invention

This invention relates to integrated circuit testing and repair, and more particularly to the repair of embedded memory devices.

2. Description of the Related Art

Advances in integrated circuit fabrication technology continue to enhance the ability to form increasingly more circuitry upon integrated circuit chips. As the complexity of circuitry formed upon chips increases, the complexity of the testing required to ensure the circuitry functions correctly also increases. However, conventional testing using external test equipment is made extremely difficult as much of the circuitry formed on integrated circuit chips is typically not controllable or observable from input/output (I/O) pads. This is especially true of memory arrays formed along with random logic circuitry upon integrated circuit chips (i.e., embedded memory arrays). A solution to the chip testing problem increasingly being adopted is to incorporate testing circuitry along with the operational circuitry upon the integrated circuit chips themselves. Built-in self-test (BIST) circuitry is one example of such testing circuitry. Array BIST (ABIST) circuitry is commonly used to test proper operation of embedded memory arrays.

In addition to the above, increasing size, density and complexity in memory technologies lead to higher defect density and a corresponding decrease in yield. One technique for dealing with such defects involves built-in self-repair (BISR). Generally speaking, BISR consists of replacing defective memory columns with spare columns. BISR may be implemented at the column, row, block or bit level. Memory cells of memory arrays are typically arranged in orthogonal rows and columns. Memory arrays are typically fabricated with redundant rows and/or columns to enable repairs on the array subsequent to fabrication. Rows and/or columns of the memory array which do not function correctly may be identified and replaced by the redundant rows and/or columns subsequent to fabrication. Replacement mechanisms include current-blown fuses and laser-blown fuses. Such fuses may be selectively blown in order to deselect a failing portion of the array and select a redundant portion to replace the failed portion. However, directly associating fuses with repair elements on a CPU die with many arrays may be inefficient as it is likely that only a few repairs may need to be done. If many repairs need to be done to the arrays, it is likely that there would be a defect in the logic as well and the die may be unsalvageable in any event.

Accordingly, an efficient method and mechanism for performing repairs is desired.

SUMMARY OF THE INVENTION

A method and mechanism for encoding and decoding repairs is contemplated. In one embodiment, a computing system includes a built in self repair (BISR) mechanism configured to perform repairs to a device. The BISR mechanism is configured to store repair information in a compressed format.

In one embodiment, an encoding for repairs comprises an encoding format in which various portions of the format are identifiable as corresponding to particular portions of a target device. A device, such as a cache memory, is logically partitioned into a plurality of sub-portions. Various portions of the sub-portions are identifiable as different levels of a hierarchy of the device. A first sub-portion may correspond to a particular cache, a second sub-portion may correspond to a particular way of the cache, a third sub-portion may corresponds to a particular group of rows, and so on. In one embodiment, the encoding format generally comprises a series of bits with a first portion corresponding to a first level of the hierarchy, and a second portion of the bits corresponds to a second level of the hierarchy. Each of the first and second portions of bits are preceded by a different valued bit which serves to identify the hierarchy to which the following bits correspond. A sequence of repairs are typically encoded as a sequence of bits. The bit which follows a complete repair encoding indicates whether the following repair is applicable to the currently identified cache or whether a new cache is targeted by the following repair. Therefore, certain repairs may be encoded without respecifying the entire hierarchy.

In another embodiment, a repair encoding may identify more than one repair to an identified sub-portion of a device. For example, a repair to a portion of an L2 cache may specify a repair to either a Tag portion of the cache or a corresponding Data storage portion of the cache. In one embodiment, each of the repair to the Tag or Data portions may be preceded by a bit which indicates whether the repair is valid. If one of the repairs is invalid, a single bit may be used to indicate this fact.

Also contemplated are embodiment wherein multiple bits are utilized in an encoding format to identify multiple levels of hierarchy or portions of a target device. In one embodiment, two bits precede, and are used to identify, particular levels of hierarchy in a repair encoding. In such an embodiment, the bits following a complete repair encoding indicate to which level of the hierarchy the following repair applies.

BRIEF DESCRIPTION OF THE DRAWINGS

Other objects and advantages of the invention will become apparent upon reading the following detailed description and upon reference to the accompanying drawings in which.

Figure 1:
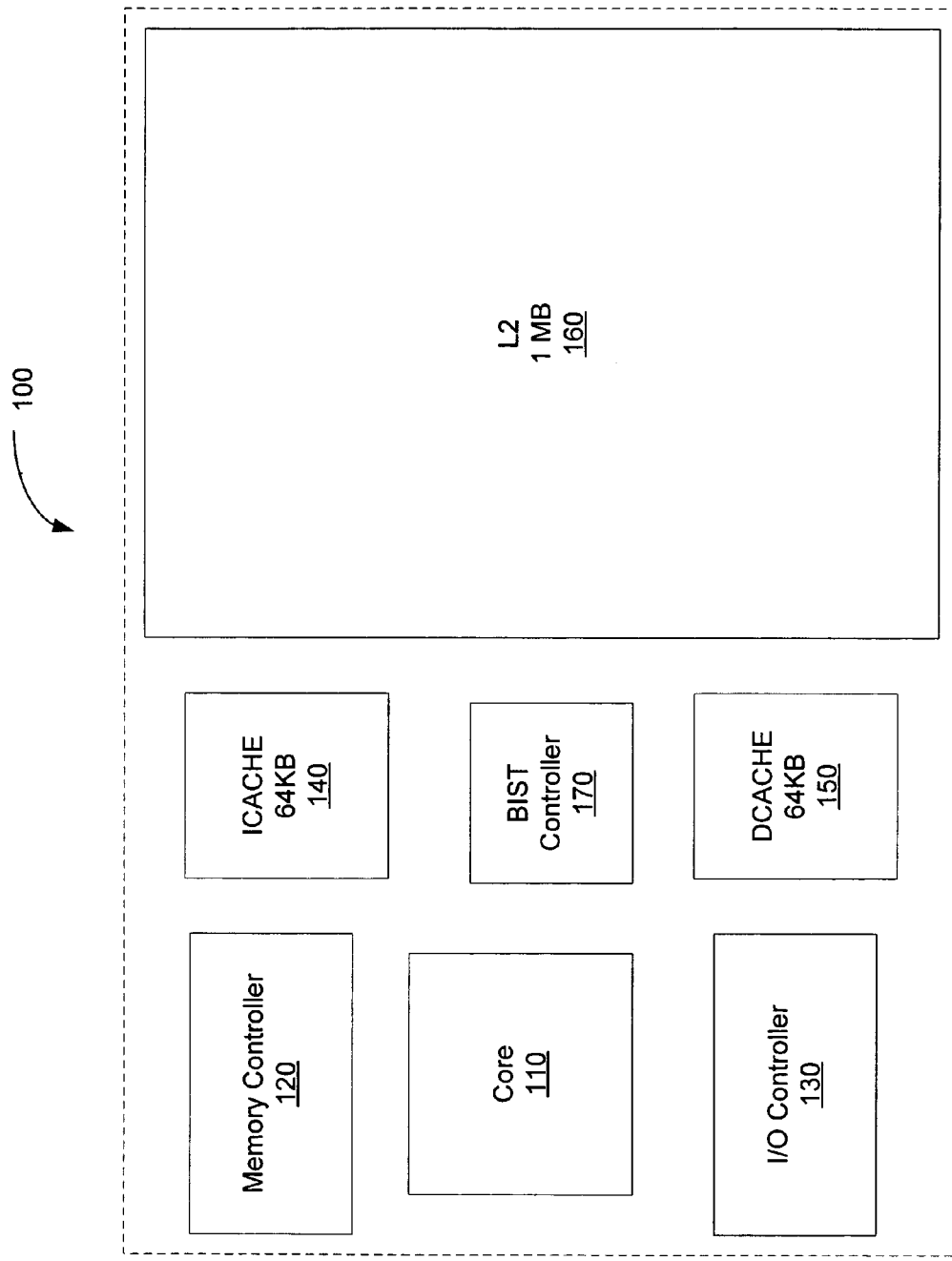
FIG. 1 depicts one embodiment of a microprocessor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 illustrates a block diagram of one embodiment of a microprocessor 100 configured to perform self test and repair. In one embodiment, each of the components illustrated in FIG. 1 may be manufactured on a single die. Processor 100 includes a core 110, memory controller 120, I/O controller 130, instruction cache (Icache) 140, data cache (Dcache) 150, level 2 (L2) cache 160 and built in self test (BIST) controller 170. Icache 140 and Dcache 150 may be level 1 (L1) caches. For purposes of discussion, assume the L2 cache includes 1 MByte of storage, while each of the instruction 140 and data 150 caches includes 64 Kbytes of storage. Consequently, the L2 cache 160 is configured to store 16 times the data of either the Icache 140 or the Dcache 150. The cache blocks in the block diagram have been drawn to approximate the relative size of each of the caches.

Generally speaking, the likelihood of a defect in a component of a die corresponds to the amount of area occupied by the component. For example, assuming the L2 cache 160 illustrated in FIG. 1 occupies one half the area of the processor die 100, there is a 50% chance that a single defect in the die will be within the area occupied by the L2 160. Similarly, if the instruction cache 140 occupied $1/24^{th}$ the area of the die 100, then there is a 4% chance that a single defect in the die is within the Icache 140. It is further noted that larger arrays may be constructed in a more technologically aggressive manner which may increase the likelihood of defects. Consequently, an efficient encoding may be even more important for such larger arrays.

In one embodiment, each of the caches and/or other storage elements in the processor 100 has one or more associated repair elements. While it may seem desirable to have a great many repair elements in order to repair a large number of defects, if many repairs need to be done it is likely that there is a defect in the logic as well and the die may be unsalvageable. Consequently, choosing the number of repair elements for a particular processor or device may take into consideration the type of logic/application for which the device is designed, the manufacturing process being used, and so on.

In one embodiment, each of the caches or storage elements is partitioned into multiple sub-portions. For example, the L2 cache 160 may be partitioned into 32 sub-portions and each of the L1 caches (140, 150) partitioned into 16 sub-portions. Each of these sub-portions may then have one or more associated repair elements. In one embodiment, each of the L2 sub-portions may have three repair elements—a tag repair, a left side repair, and a right side repair. Each of the L1 sub-portions may have a single repair element. In one embodiment, each L2 repair may be identified by an encoding which includes a valid bit and 6 address bits. Each L1 repair may be identified by an encoding which includes a valid bit and 7 address bits. If fuses were directly associated with each of the repair sites, a relatively large number of fuses would be required. For example, the L2 would require 32(sub-portions)×3(elements)×7(bits)=672 fuses. The L1 caches would require 2(caches)×16(sub-portions)×8(bits)=256 fuses. Consequently, a total of 928 fuses would be required. In order to manage BISR more efficiently, a method and mechanism for encoding repairs is described below.

In one embodiment, a processor or other device with a BISR mechanism utilizes variable length encoding. As will be described, the mechanism may enable a more efficient encoding of repairs which in turn may require less die space for the mechanism itself.

In one embodiment, a hierarchical repair encoding scheme is utilized. In such an embodiment, caches or other devices in a system are logically partitioned into two or more sub-portions. Each of the sub-portions may be generally viewed as levels of hierarchy within the partitioning scheme. For example, a two-way set associative L1 cache may include a first level of partitioning which distinguishes between the first and second ways. A second level of partitioning may distinguish between a select group of rows of a particular way. A third level of partitioning may distinguish between particular rows or columns, and so on. As may be seen from such a scheme, each level of partitioning generally corresponds to a finer grain of detail in the given cache or device. To this extent, the various levels of partitioning may be viewed as levels within a hierarchy, with the first level being the less detailed and each succeeding level being more detailed.

In the following tables, one embodiment of a hierarchical encoding scheme for use in a BISR mechanism is illustrated. For purposes of discussion, both L1 and L2 caches in the context of a microprocessor will be described. However, it is noted that the methods and mechanisms described herein may be applied to other microprocessor configurations, circuitry, or devices, which include BISR mechanisms.

TABLE 1

L1 Repair Encoding

| Cache  | Cache ID | Way/Portion | Repair Address |
|--------|----------|-------------|----------------|
| Icache | 0 010    | 1 w mmm     | rrrrrrr        |
| Dcache | 0 011    | 1 w mmm     | rrrrrrr        |

KEY:
w = way
m = sub-portion of cache
r = repair unit

Table 1 above illustrates one embodiment of a hierarchical format of repair encodings which may be used for L1 memory arrays. The first column of Table 1 indicates a particular cache, the second column indicates an identifier for the particular cache, the third column illustrates the encoding format corresponding to a particular portion of the cache, and the fourth column corresponds to a smaller sub-portion of the cache. In Table 1 above, each of the Cache ID, Way/Portion, and Repair Address columns may be viewed as corresponding to different levels of hierarchy. In this case, the Cache ID would represent the higher level within the hierarchy, and the Repair Address would represent the lowest level within the depicted hierarchy. In this example, the Cache ID hierarchy may be distinguished from the Way/Portion hierarchy by the first bit of the corresponding encoding. For example, encodings which identify a hierarchical level corresponding to a Cache ID begin with a "0" bit. On the other hand, encodings which identify a hierarchical level corresponding to a Way/Portion begin with a "1" bit. Consequently, as will be discussed further below, various bit sequences may be identified as corresponding to a particular level of a hierarchy.

Based upon the format illustrated in Table 1, the number of repairs which may be specified for each cache is determined by the number of bits available for addressing a particular portion of the cache. In the example above, the number of possible repairs which may be specified is: 2(one w bit)×8(three m bits)×128(seven r bits)=2048 repairs. If, for example, each repairable unit is 32 bytes, then the size of each L1 cache may be 2048×32 bytes=64 Kbytes.

Utilizing the format shown in Table 1, an example of a repair to an Icache may be represented as follows:

0010__1wmmm_rrrrrrr

Similarly, a Dcache repair may be represented as:

0011__1wmmm_rrrrrrr

In a non-variable length encoding embodiment, each repair may be encoded in sequence as described above. Consequently, five repairs to the Icache may be encoded as follows:

0010__1wmmm_rrrrrrr (repair #1)
0010__1wmmm_rrrrrrr (repair #2)
0010__1wmmm_rrrrrrr (repair #3)
0010__1wmmm_rrrrrrr (repair #4)
0010__1wmmm_rrrrrrr (repair #5)

In this embodiment, 5×16 bits=80 bits are required to encode five repairs to the Icache. In a variable length encoding embodiment, multiple repairs to a particular cache may be specified without re-specifying every level within the hierarchy. For example, assuming the same five repairs to the Icache as shown above, an alternative encoding may be as follows:

0011__1wmmm_rrrrrrr (repair #1)
1wmmm_rrrrrrr (repair #2)
1wmmm_rrrrrrr (repair #3)
1wmmm_rrrrrrr (repair #4)
1wmmm_rrrrrrr (repair #5)

The first repair illustrated in this example shows a repair to the Icache (0010) is identified. Following the first repair, the next bit encountered is a "1" bit which corresponds to the Way/Portion hierarchy. In one embodiment, levels of hierarchy above the Way/Portion hierarchy are assumed to be unchanged. In this example, by presenting the repairs in sequence, it is assumed that if no cache is identified by a particular repair, then the previously identified cache is implied. The first repair explicitly identifies the cache (the first level of the hierarchy) to which the repair is directed. The following four repairs implicitly identify the cache to which they are directed. Consequently, in this embodiment, (16 bits)+(4×12 bits)=64 bits are required to encode five repairs. Therefore, in this simple example with only five repairs, a 20% reduction in the number of bits required to encode the repairs has been achieved.

Figure 2:
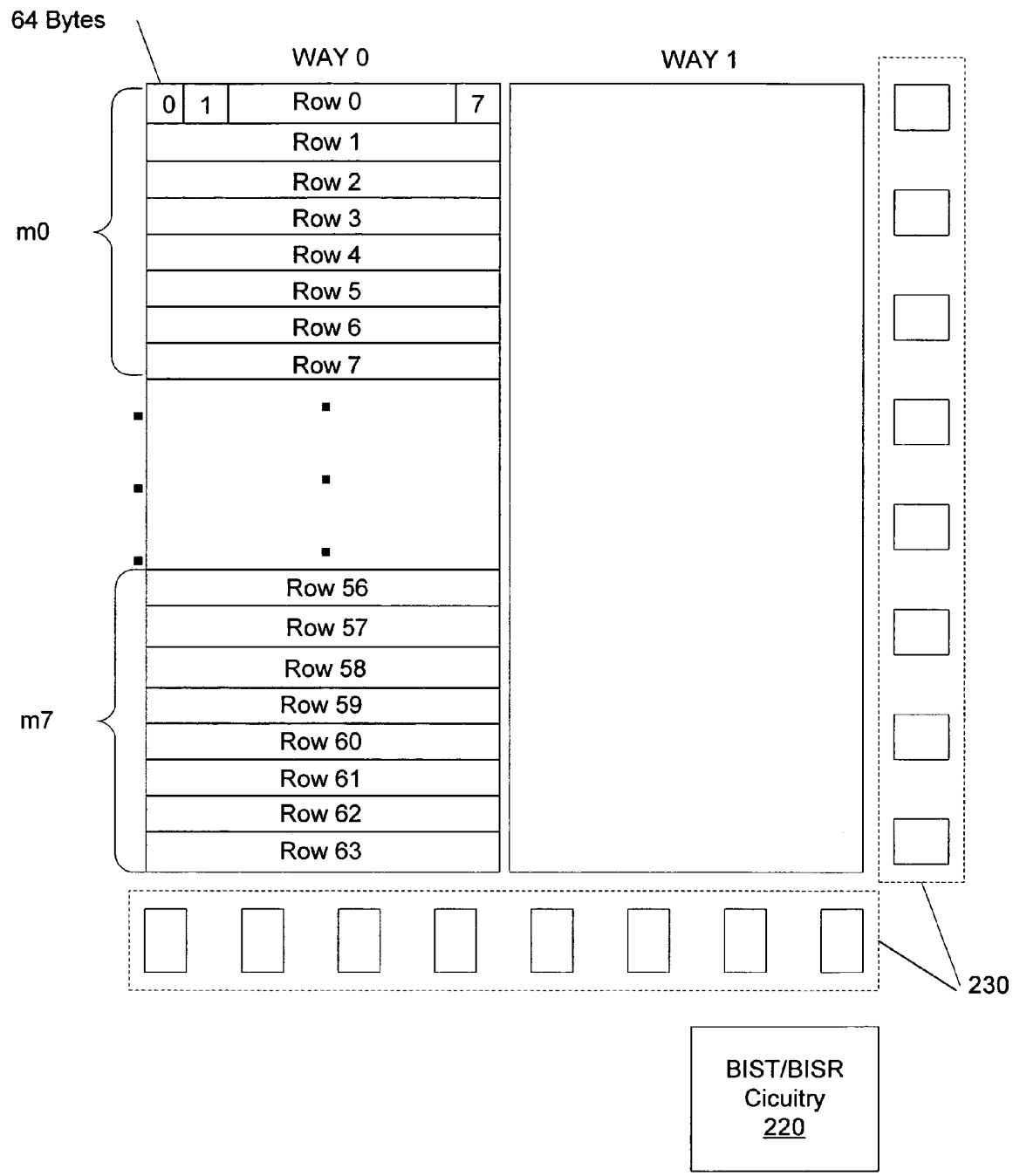
FIG. 2 depicts one embodiment of a cache and related circuitry.
Figure 3:
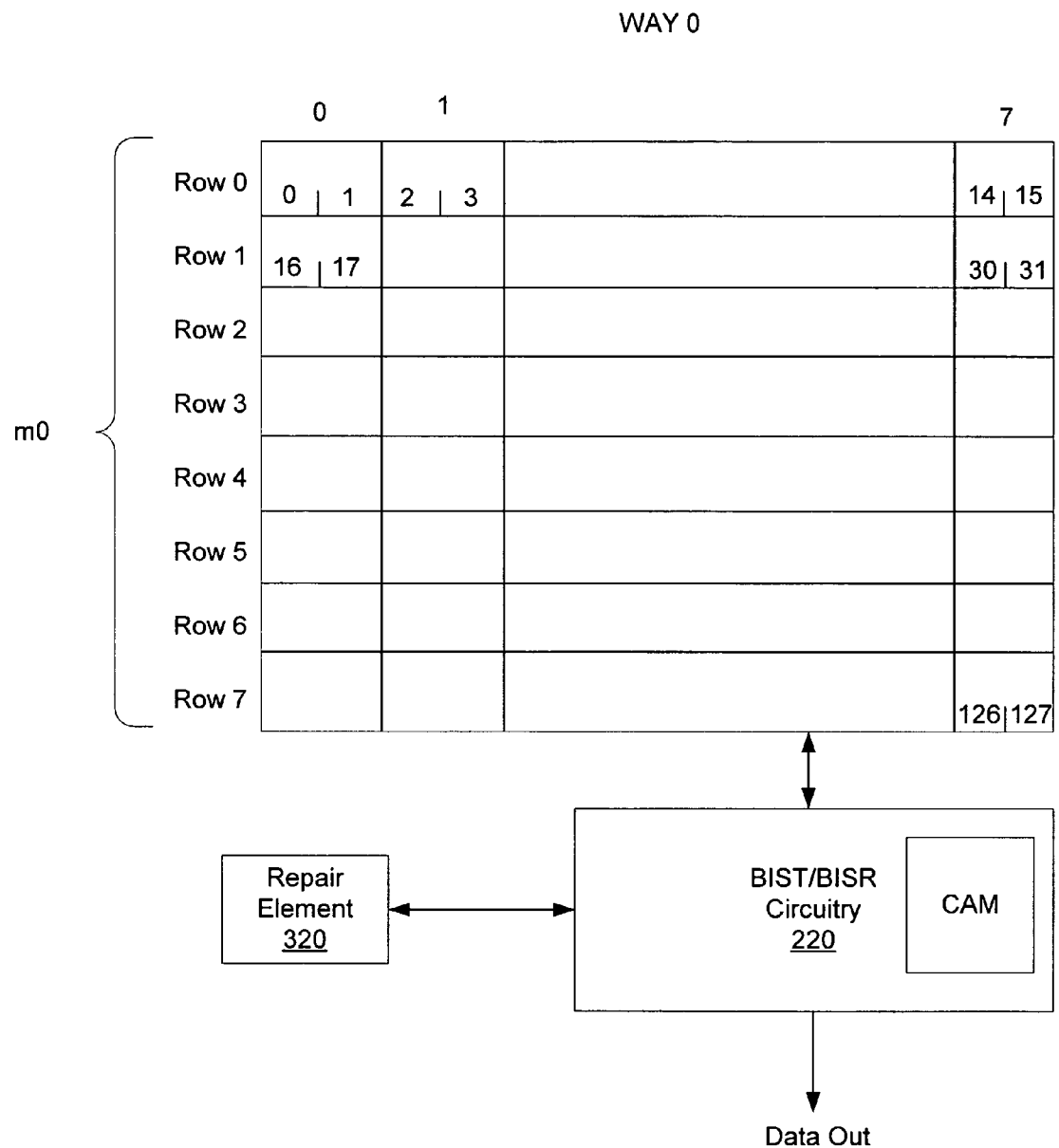
FIG. 3 depicts one embodiment of a cache and related circuitry.

FIGS. 2 and 3 depict one possible embodiment of how an L1 Cache 200 may be partitioned. In the example of FIG. 2, a 64 KB Icache 200 is shown. In this example the Icache includes 2 ways (Way 0 and Way 1), and 64 rows. In the example, the rows are divided into sub-portions of 8 rows each. The first sub-portion m0 and the last sub-portion m7 are illustrated. Each row of each way is further divided into 8 subunits of 64 bytes each. Also shown in FIG. 2, is BIST/BISR circuitry and a plurality of repair elements 230. Repair elements may comprise redundant rows, columns, and or other redundant storage elements.

Using the L1 format described in Table 1 above, assume the following particular repair encoding:

| Cache ID | w | mmm | rrrrrrr |
|----------|---|-----|---------|
| 0010 | 1 | 0 | 000 | 0011111 |

Based on the format of Table 1, the first 4 bits of the above encoding (0010) identify the Icache. The fifth bit (1) is used to indicate that a repair corresponding to the previously identified cache (0010) follows. As will become apparent in the discussion that follows, this fifth bit may be used to distinguish further repairs to a particular cache from repairs directed to an alternate cache. The sixth bit above (0) indicates the way of the cache. The seventh through ninth bits above indicate a particular sub-portion of the cache, and the final seven bits indicate a particular unit to be repaired.

Comparing the example repair encoding above to FIG. 2, the cache ID (0010) indicates the Icache is addressed. Following the Cache ID is a "1" bit which indicates a repair corresponding to the previously identified cache (Icache 0010) follows. The sixth bit "0" identifies way 0 of the cache, the next three bits "000" indicate sub-portion zero (m0), and finally the last seven bits "0011111" identify portion/unit 31. FIG. 3 illustrates a portion of the cache in FIG. 2 which includes the identified repair unit.

FIG. 3 depicts a sub-portion (m0) of way 0 of the Icache. Also shown in FIG. 3 is BIST/BISR circuitry 220 and a repair element 320. As seen in the example, sub-portion m0 includes eight rows, Row 0-Row 7. In addition, as previously discussed, each of these rows are partitioned into eight 64 byte portions. Further, each of these eight 64 byte portions are shown to be subdivided into 32 byte units, each of which are identifiable using the format of Table 1. Consequently, the portion of the cache depicted in FIG. 3 includes 128 separately identifiable (by the repair encoding) units. For purposes of discussion, the first identifiable unit appears in the upper left corner of the portion in FIG. 3, and the 128$^{th}$ identifiable unit appears in the lower right corner. A particular unit of the 128 units may be identified by the seven Repair Address bits of the encoding depicted in Table 1. It is to be understood that the particular configuration of the caches as described herein is exemplary only. Those skilled in the art will appreciate that there are numerous ways to configure memory devices and numerous ways to address such devices. The methods and mechanisms described herein are applicable to such alternatives configurations and addressing schemes and are intended to embrace such alternatives.

In one embodiment, BIST/BISR circuitry 220 includes a content addressable memory (CAM) configured to store addresses to be repaired and corresponding repair units. For example, repair element 320 may comprise a redundant row which serves to replace a defective row in the depicted sub-portion. In such an embodiment, addresses corresponding to defective units are mapped to addresses which identify a repair element. A variety of techniques for performing repairs are possible and are contemplated. For example, row redundancy schemes may utilize a remapping circuit that compares incoming addresses with stored defective addresses. If the incoming address matches a defective address, a corresponding redundant row address is activated and the defective row is disabled. Various techniques for disabling defective rows are available. In one method, a memory word line may be disabled when the redundant row address is activated. Alternatively, latches or fuses may be used at each row for disabling the row if it is found to be defective. Those skilled in the art will appreciate a number of such techniques are available. In addition, techniques other than using a CAM as depicted in FIG. 3 may be used to replace defective units.

A similar technique may be used in the encoding of repairs for an L2 cache. Because the size of an L2 cache in modern microprocessors is more readily configurable than that of the L1 caches, the example provided herein enables encoding repairs for various L2 cache sizes. Table 2 below illustrates one such embodiment. In the example of Table 2, repairs may be directed to one or more of a tag, left side, or right side of cache. As already mentioned, the particular cache configurations described herein are exemplary only.

TABLE 2

L2 Repair Encoding

| Cache | Cache ID | Way/Portion | Repair | | |
|---|---|---|---|---|---|
| | | | Tag | Left | Right |
| 128K L2 | 01 | 1ww | (0 + 1) rrrrrr | (0 + 1) rrrrrr | (0 + 1) rrrrrr |
| 256K L2 | 010 | 1wwm | (0 + 1) rrrrrr | (0 + 1) rrrrrr | (0 + 1) rrrrrr |
| 512K L2 | 0100 | 1wwmm | (0 + 1) rrrrrr | (0 + 1) rrrrrr | (0 + 1) rrrrrr |
| 1M L2 | 01000 | 1wwmmm | (0 + 1) rrrrrr | (0 + 1) rrrrrr | (0 + 1) rrrrrr |
| 2M L2 | 010000 | 1wwmmmm | (0 + 1) rrrrrr | (0 + 1) rrrrrr | (0 + 1) rrrrrr |

KEY:
w = way
m = sub-portion of cache
r = repair address

Table 2 illustrates possible encoding formats for five different L2 cache sizes. The first row of the table corresponds to a 128 Kbyte L2, the second row corresponds to a 256 KB L2, the third row corresponds to a 512 KB L2, the fourth a 1 MB L2, and the last a 2 MB L2. Similar to Table 1, a cache ID which identifies the target cache is included in the second column and begins with a "0" bit. The third column in Table 2 identifies a particular portion of the cache and begins with a "1". As before, a Cache ID may be distinguished from a Way/Portion identifier by the first bit. In this example, L2 Cache IDs begin with the bit sequence "01", as opposed to the L1 encodings of Table 1 wherein Cache IDs begin with the bit sequence "00". Consequently, L1 repairs may be distinguished from L2 repairs. Following the Cache ID in Table 2 is zero or more "0" bits terminated by a "1" bit depending on the size of the L2 Cache. Following the terminating "1" bit is a Way/Portion identifier. In the embodiment shown, the L2 cache has two way bits for identifying one of four ways. The number of identifiable sub-portions (m) depends upon the size of the L2 cache. The repair column includes three sub-columns: Tag, Left, and Right. As seen from the example of Table 2, repairs to a cache may be directed to either the Tag, or a Left or Right side. However, those skilled in the art will appreciate that other configurations and partitioning of the L2 into repairable sections are possible. In such alternative configurations, repairs which are directed to Tag, Left, and/or Right portions of the cache may be changed to reflect the alternate cache configuration. Such alternative configurations and encodings are contemplated as well.

As shown in Table 2, a particular repair encoding directed to the Tag, Left, and/or Right portions of the addressed portion of the cache may be represented by seven bits beginning with either a "0" or a "1" (the notation "0"+"1" indicates either "0" or "1"). In this embodiment, the first Repair bit directed to the Tag, Left, or Right portion may be viewed as a valid bit. If the first bit is "1", then the indicated repair is valid. If the first bit is "0", then the indicated repair is invalid (i.e., no repair is indicated). A few examples of L2 repair encodings are illustrated below.

A repair to the tag side of a 1M L2:
  01000_1wwmmm_1rrrrrr_0rrrrrr_0rrrrrr (repair #1)

A repair to the left side of a 1M L2:
  01000_1wwmmm_0rrrrrr_1rrrrrr_0rrrrrr (repair #2)

A repair to the right side of a 1M L2:
  01000_1wwmmm_0rrrrrr_0rrrrrr_1rrrrrr (repair #3)

A repair to the tag, left and right sides of a 1M L2:
  01000_1wwmmm_1rrrrrr_1rrrrrr_1rrrrrr (repair #4, #5 and #6)

As seen from the last example given above, repairs to more than one portion (Tag, Left and Right) may be indicated by a single encoding. Therefore, the above four endings identify six repairs. Each of the above repair encodings requires 32 bits for a total of 128 bits.

Utilizing the above described variable length encoding technique for implicitly identifying the cache to which a repair is directed, the four L2 repairs illustrated above may be represented as follows:
  01000_1wwmmm_1rrrrrr_0rrrrrr_0rrrrrr (repair #1)
  1wwmmm_0rrrrrr_1rrrrrr_0rrrrrr (repair #2)
  1wwmmm_0rrrrrr_0rrrrrr_1rrrrrr (repair #3)
  1wwmmm_1rrrrrr_1rrrrrr_1rrrrrr (repair #4, #5 and #6)

Therefore, as was the case with the L1 examples provided above, the number of bits required to encode the repairs is reduced and only 113 bits are required to indicate the desired repairs.

Table 3 below illustrates an alternative embodiment for encoding L2 repairs.

TABLE 3

L2 Repair Encoding

| Cache | Cache ID | Macro | Repair | | |
|---|---|---|---|---|---|
| | | | Tag | Left | Right |
| 128K L2 | 01 | 1ww | 0 or 1rrrrrr | 0 or 1rrrrrr | 0 or 1rrrrrr |
| 256K L2 | 010 | 1wwm | 0 or 1rrrrrr | 0 or 1rrrrrr | 0 or 1rrrrrr |
| 512K L2 | 0100 | 1wwmm | 0 or 1rrrrrr | 0 or 1rrrrrr | 0 or 1rrrrrr |
| 1M L2 | 01000 | 1wwmmm | 0 or 1rrrrrr | 0 or 1rrrrrr | 0 or 1rrrrrr |
| 2M L2 | 010000 | 1wwmmmm | 0 or 1rrrrrr | 0 or 1rrrrrr | 0 or 1rrrrrr |

In the embodiment of Table 3, rather than using seven bits to indicate a valid or invalid repair, invalid repairs are indicated by a single "0" bit. Consequently, fewer bits are needed to encode L2 cache repairs. Again using the example from above, the six repairs may be encoded as follows:

01000_1wwmmm_1rrrrrr_0_0 (repair #1)

1wwmmm_0_1rrrrrr_0 (repair #2)

1wwmmm_0_0_1rrrrrr (repair #3)

1wwmmm_1rrrrrr_1rrrrrr_1rrrrrr (repair #4, #5 and #6)

Therefore, utilizing the repair format of Table 3, only 77 bits are needed to encode the six repairs.

Figure 4:
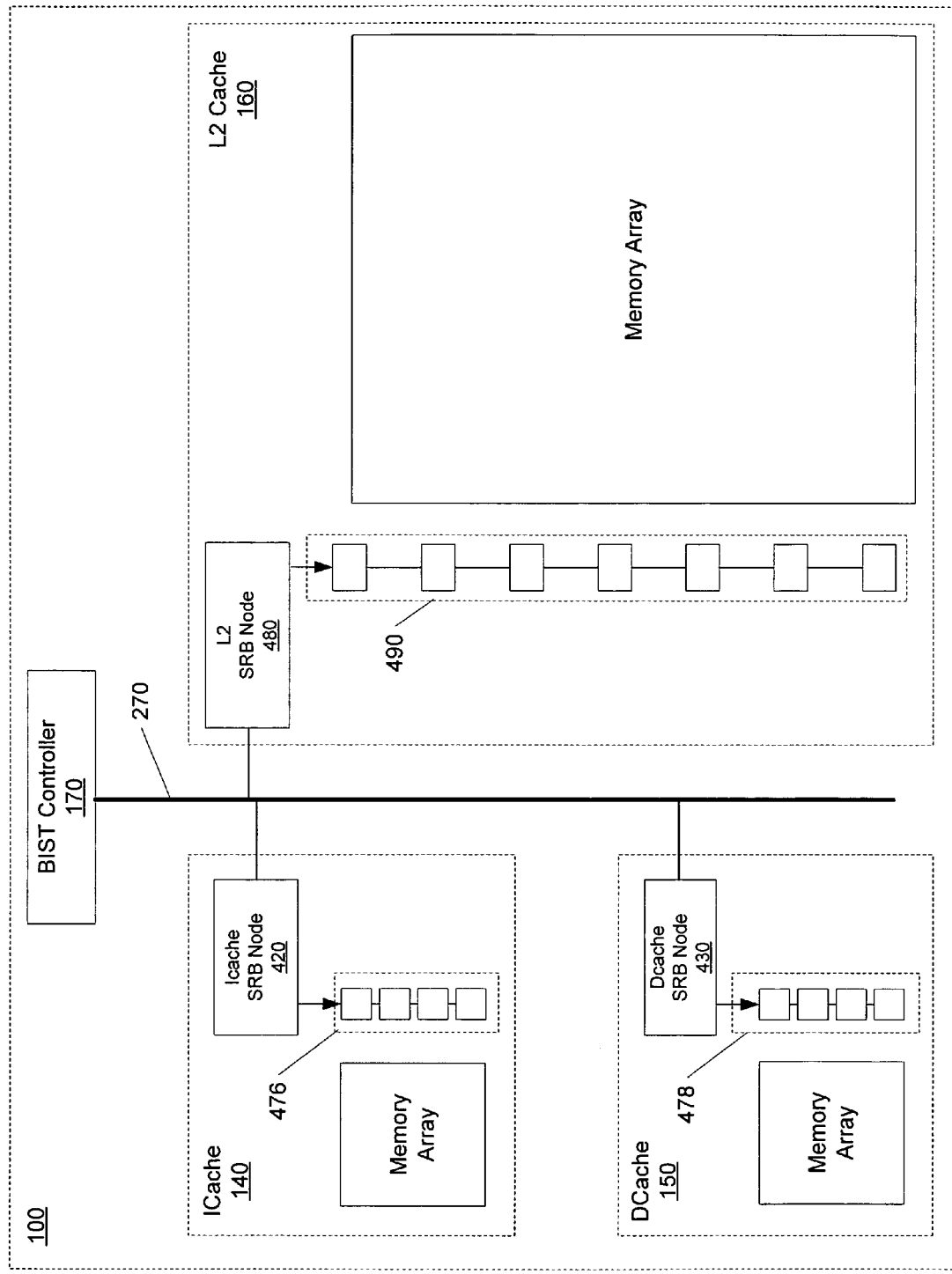
FIG. 4 depicts one embodiment of a cache repair subsystem.

Turning now to FIG. 4, one embodiment of a portion of microprocessor 100 is shown. In the embodiment of FIG. 4, a BIST controller 170, L2 Cache 160, Icache 140, and Dcache 150 are shown. Also shown is a special register bus 270 coupled to special register bus (SRB) nodes 480, 420, and 430. Each of the depicted SRB nodes corresponds to one of the caches. For example, SRB node 480 corresponds to L2 cache 160, SRB node 420 corresponds to Icache 140, and SRB node 430 corresponds to Dcache 150. Each of the SRB nodes 420, 430, 480 are further coupled to one or more repair elements corresponding to the particular cache. SRB node 480 is coupled to repair elements 490, SRB node 420 is coupled to repair elements 476, and SRB node 430 is coupled to repair elements 478. Finally, each of the caches are shown to include a memory array. While the embodiment shown depicts the respective SRB nodes and repair elements as being included within each cache, this need not be the case.

Generally speaking, BIST controller 170 is configured to convey repair instructions via special register bus 270 to one or more of the SRB nodes 420, 430, 480 in the processor 100. Repair information conveyed by controller 170 may generally include information which identifies the cache to be repaired and the particular sub-portion of the cache being repaired. In one embodiment, BIST controller 170 conveys the repair information via bus 270. Each of the SRB nodes 420, 430, 480 observes the bus 270 to determine whether repair information is being conveyed which corresponds to its respective cache. For example, repairs directed to the L2 cache 160 may include an identifier corresponding to the L2 cache 160 which is recognized by L2 node 280. Responsive to detecting that received repair information is directed to the L2 cache 160, L2 node 280 may then capture and apply received repair information for the L2 Cache 160. If an SRB node (280, 282, 284) receives repair information which is not directed to the receiving node, the received repair information may generally be ignored.

When an SRB node (280, 282, 284) receives repair information directed to its corresponding cache, the node may then perform the indicated repairs on the cache utilizing available repair elements. For example, in one embodiment the repair information may identify a defective address which is then mapped to an alternate address corresponding to a redundant resource. It is noted that repair elements 276, 278, and 290 may comprise redundant rows, columns, blocks, or any other suitable repair element.

Figure 5:
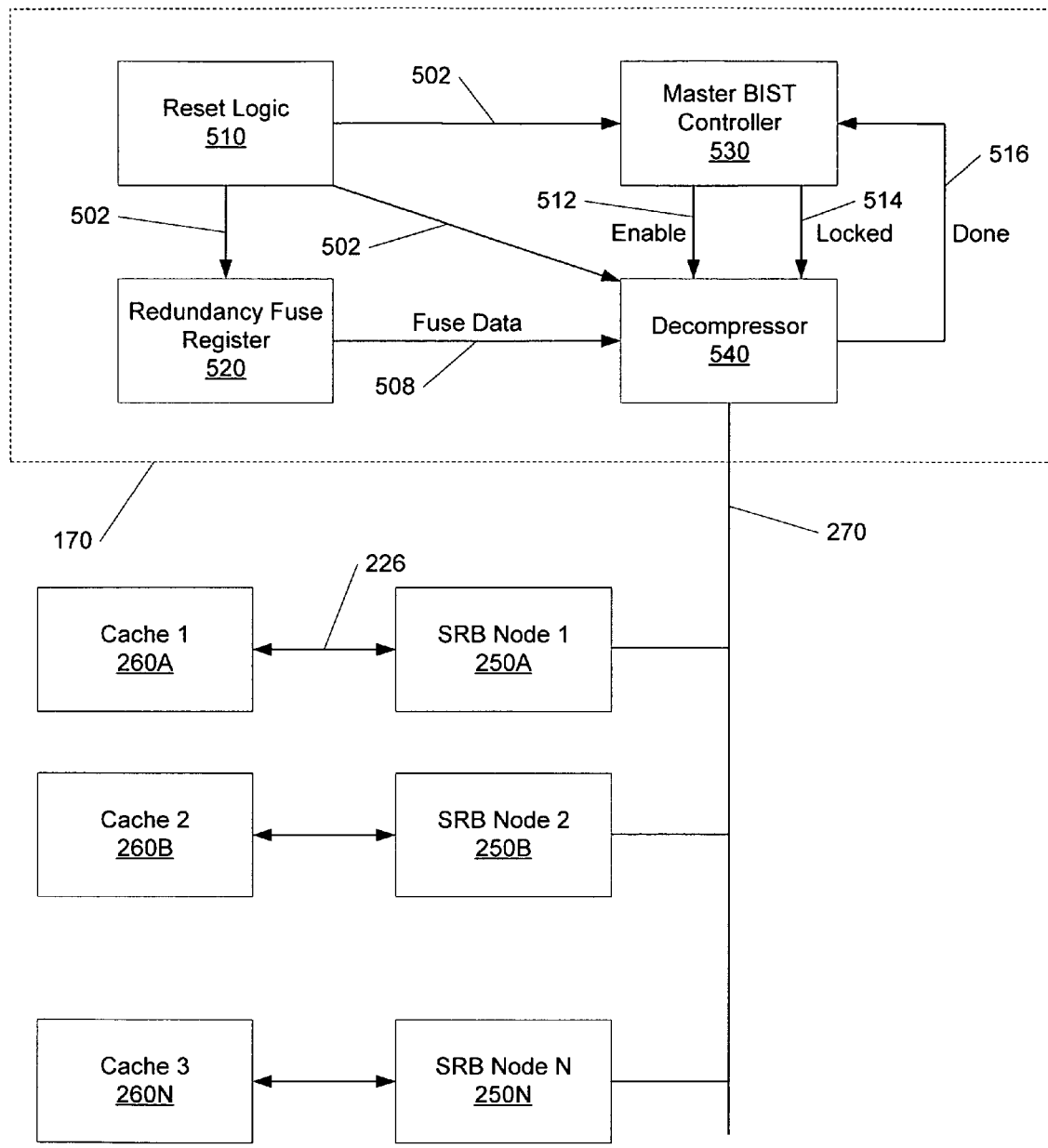
FIG. 5 depicts one embodiment of a cache repair subsystem.

Turning now to FIG. 5, a block diagram of one embodiment of a repair subsystem is shown. A BIST/BISR control unit 170 is shown coupled to a first node 250A of multiple nodes 250 via special register bus 270. In one embodiment, bus 270 comprises and eight bit address bus and a thirty two bit data bus configured to convey repair information to each of nodes 250. In such an embodiment, an address identifying one of nodes 250A-250N is conveyed upon the address portion of the bus 270, followed by a defective address and a repair address. Other embodiments for bus 270 are possible and are contemplated. For example, bus 270 may form a single bit shifted in circular fashion between the nodes 250. In various embodiments bus 270 may comprise an entirely separate bus or may comprise existing scan chain or other test related circuitry. In addition, each of SRB nodes 250A-250N are coupled to one of a number of storage devices; namely, caches 260A-260N, respectively. Each of nodes 250 is generally configured to operate in the manner of nodes 420, 430, 480, as described in FIG. 4. For example, SRB node 250A is configured to identify repair information received from BIST/BISR unit 170 which is directed to cache 260A. Elements referred to herein with a particular reference number followed by a letter will be collectively referred to by the reference number alone. For example, nodes 250A-250N may be collectively referred to as nodes 250.

In the embodiment of FIG. 5, BIST/BISR unit 170 includes reset logic 510, redundancy fuse register unit 520, master BIST controller 530, and decompressor 540. Reset logic 510 may be generally configured to convey a reset signal 502 to register unit 520, controller 530, and decompressor 540 which may be utilized by the various components to enter a predetermined state. For example, upon startup or reboot of the system, a reset signal may be conveyed to one or more of the components in the system. Redundancy fuse register 520 is configured to store repair information for caches 260. In one embodiment, fuse register unit 520 is a write only memory and may be programmed via blown fuses. In addition, fuse register unit 520 may be configured to store repair information in a compressed format. The compressed format used to store the repair information in fuse register 520 may generally conform to the format described in Table 1, Table 2, and/or Table 3. Decompressor 540 is configured to receive the compressed repair information from fuse register 520 and convey repair information to each of nodes 250.

Master BIST controller 530 is configured to control built in self testing and repair for the system. Numerous such self test techniques are known and are contemplated. In one embodiment, BIST controller 530 may first initiate the application of the repair information stored in the fuse register unit 520 ("hard" coded repairs) to the various caches 250 within the system. Subsequent to applying the indicated repairs, self testing of the system may proceed. If errors are detected during the subsequent self testing, additional "soft" repairs may be made to the failing memory components. In one embodiment, soft repairs may be made by performing writes to registers within one or more of SRB nodes 250. Subsequent to making soft repairs, additional self testing may be performed. If the additional self testing also fails, and additional soft repairs are not possible, a system failure condition may be indicated. Such an indication may comprise a message indicating a failed component or any other message deemed suitable.

It is noted that additional hard coded repairs may be effected within fuse register unit 520 if necessary. For example, during initial testing of a manufactured device, a tester may identify defects and program the fuse register unit 520 in order to repair the detected defects. Subsequent to programming fuse register unit 520, the device may be tested again to ensure the repairs have been properly implemented. If additional defects remain, new repairs may be appended to those already programmed into the fuse register unit 520. In this manner, a device may be salvaged even if the first repairs were not entirely successful.

Figure 6:
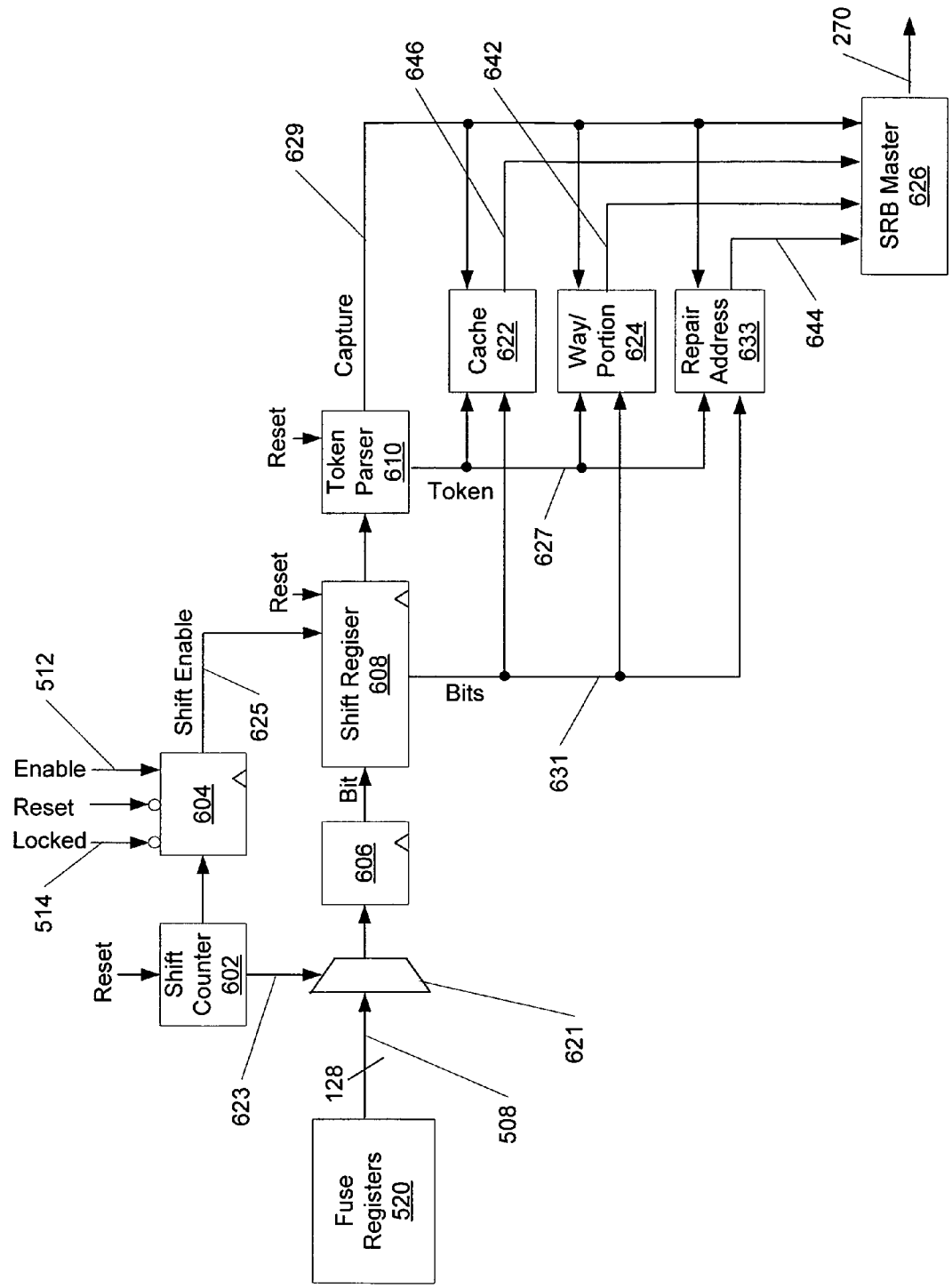
FIG. 6 depicts one embodiment of a repair encoding decompressor.

Turning now to FIG. 6, one embodiment of the decompressor 540 shown in FIG. 5 is illustrated. Generally speaking, decompressor 540 is configured to receive compressed repair data, decompress the received data, and convey repair information. In one embodiment, fuse register 520 concurrently conveys 128 bits of compressed repair data to multiplexor 621 via bus 508. Shift counter 602 conveys a select signal 623 to multiplexor 621 which controls which of the received compressed bits is conveyed to latch 606. Shift register 608 receives as input the bit which has been latched by latch 606 and conveys the state of its register bits via bus 631. Shift register 608 also receives a latch enable signal 625 which controls whether or not the shift register 608 latches data from latch 606. The state of the shift enable signal 625 may be controlled by the enable signal 512 and the locked signal 514 which are conveyed from the master BIST controller 530 shown in FIG. 5. In one embodiment, the shift enable signal 625 is asserted when the enable signal 512 is asserted and the locked signal 514 is negated. Locked signal 514 may be asserted after applying hard coded repairs in order to maintain such repairs during a soft reset.

Token parser 610 receives as input bits which are latched by the shift register 608. Generally speaking, the token parser 610 is configured to recognize particular sequences of bits (i.e., "tokens") as cache identifiers, way/portion identifiers, and repair addresses. Upon recognizing a particular token, token parser 610 conveys a signal 627 which corresponds to the identified token and may also convey a signal 629 which indicates data is to be captured by one or more of cache register 622, way/portion register 624, repair address register 633, and SRB master 626. SRB master 626 is further coupled to receive data from the cache register 622, way/portion register 624, and repair address register 633.

In one embodiment, each of the cache register 622, way/portion register 624, and repair address register 633 are configured to capture data received via bus 631 in response to receiving a capture signal 629 and a particular token signal 627. For example, upon recognizing a token as a cache ID corresponding to an Icache (e.g., bits "0010" in Table 1), token parser 610 may convey both a capture signal 629 and a token signal 627 indicating the token is a cache ID. In response, cache register 622 may then latch the cache ID bits from bus 631. Similarly, way/portion register 624 may latch data from bus 631 in response to a capture signal 629 and a token signal 627 which indicates the token corresponds to a way/portion identifier. Finally, repair address register 633 may latch data from bus 631 in response to a capture signal 629 and a token signal 627 which indicates the token corresponds to a repair address identifier. In response to latching complete repair information, SRB master 626 may then convey a repair command via bus 270. Such a command may include a target cache ID and the identification of a defective address. In one embodiment, SRB nodes which receive the conveyed repair information via bus 270 may then choose which of available redundant resources are to replace, or be mapped, to the received defective address. Alternatively, SRB master 626 may itself convey both a defective address and an identification of the redundant resource as well.

In one embodiment, token parser 610 is configured to convey a capture signal 629 to SRB master 626 which indicates a complete repair encoding has been identified. In response, SRB master 626 latches a cache ID 646, way/portion 642, and repair address 644. In such an embodiment, capture signal 629 may comprise more than one bit in order to distinguish between different types of capture signals which are conveyed to one of registers 622, 624, or 633 and SRB master 626. In addition, capture signal 629 and/or token signal 627 may further indicate how many bits are to be latched by a particular register (622, 624, 633, 626). For example, an L2 cache may have identifiers of varying lengths (e.g., see Table 2 and Table 3) depending on the size of the L2 cache. Depending upon the L2 cache configuration, the token parser may also convey a signal which indicates how many bits are to be latched from bus 631. Similarly, Table 1 provides an exemplary embodiment wherein seven repair address bits are used as opposed to the six repair address bits used in the Table 2. Consequently, either six or seven bits may be latched from bus 631 depending upon whether an L1 or an L2 repair encoding is received.

In one embodiment, token parser 610 is configured to identify the size of an L2 based upon the received repair encodings. For example, Table 3 illustrates an embodiment wherein an L2 cache identifier begins with the bits "01". Upon receiving the bits "01", token parser 610 may determine an L2 identifier is being received. If a "1" bit then immediately follows the "01", token parser 610 determines a 128 KB L2 cache size. Alternatively, if the string "0001" follows the cache identifying "01" bits, then it may be determined a 1 MB L2 cache is used. Based upon such a determination, the token parser 610 may keep track of the appropriate number of bits for the given cache size. For example, a 1 MB L2 cache will have three "m" bits and a 2 MB L2 cache will have four "m" bits. In an alternative embodiment, the token parser 610 and or other components with the system may simply include configuration registers which are programmed to indicate the particular cache configuration(s) upon startup. Numerous such alternatives are possible and are contemplated.

As already discussed, repair encodings received from fuse registers 520 may conform to a hierarchal, variable length, scheme as described above in Table 1, Table 2, and Table 3. Therefore, token parser 610 may receive and identify multiple repair encodings following the identification of only a single target cache. In such a case, a single target cache ID may be identified by token parser 610 and latched by repair address register 633. Subsequently, a particular way/portion may be latched by cache register 622, and a repair address latched by way/portion register 624. After latching the cache ID, way/portion, and repair address, the SRB master 626 may then latch the repair data from each of the registers (622, 624, 633). Following a single complete repair, token parse may immediately receive and identify another repair (e.g., a way/portion and a repair address) without first receiving another target cache identifier. In such a case, the value previously latched by cache register 622 is retained and utilized for the next repair. Therefore, token parser 610 may next receive and identify a way/portion which is then latched by way/portion register 624. Next, token parser 610 identifies a repair address which is then latched by repair address register 633. Having determined a complete repair has been received, token parser 610 may then convey a corresponding capture signal 629 to SRB master 626 which captures the data on its inputs and generates a new repair command as discussed above. In this embodiment, each of registers 622, 624, and 633 may be viewed as corresponding to various levels of the repair encoding hierarchy. Cache register 622 is configured to latch the highest level in the repair encoding hierarchy, way/portion register 624 the next level in this hierarchy, and repair address register 633 the final level in the hierarchy.

It is noted that token parser 610 may also be configured to count the number of bits it has received in order to determine when a complete repair encoding has been received. For example, in an embodiment which utilizes the format of Table 1, a full repair encoding includes sixteen bits. Therefore, following the sixteenth bit of an L1 repair encoding, either a new cache ID will follow or a new way/portion will follow. As cache IDs being with a "0" bit and way/portion identifiers being with a "1" bit, the token parser 610 may identify whether a completely new repair encoding is received or an additional repair to the previously identified target cache is received.

Similarly, tracking a number of bits received may enable the token parser 610 to determine whether a completely new L2 repair encoding (as depicted in Table 2 or Table 3) is received or an additional repair is being directed to the previously identified cache. As with the embodiment of Table 1, the L2 encodings being cache ID identifiers with the bit zero and way/portion identifiers with the bit one. Therefore, completely new repairs may be identified following the designated number of bits by the value of the next bit which follows. In the embodiment of Table 2, a complete 1 MB L2 cache repair encoding will have thirty two bits. In the embodiment of Table 3, the number of bits in a repair encoding will depend on whether or not the repairs for each of the Tag, Left, and Right portions are valid. If one repair is indicated, then the number of bits in a complete repair encoding will be twenty. For example, a repair to only the Tag portion will include 5+6+7+1+1=20 bits. If two repairs are indicated, the number of bits will be 5+6+7+7+1=26 bits. Finally, if three repairs are indicated, the number of bits will be 5+6+7+7+7=32 bits.

Figure 7:
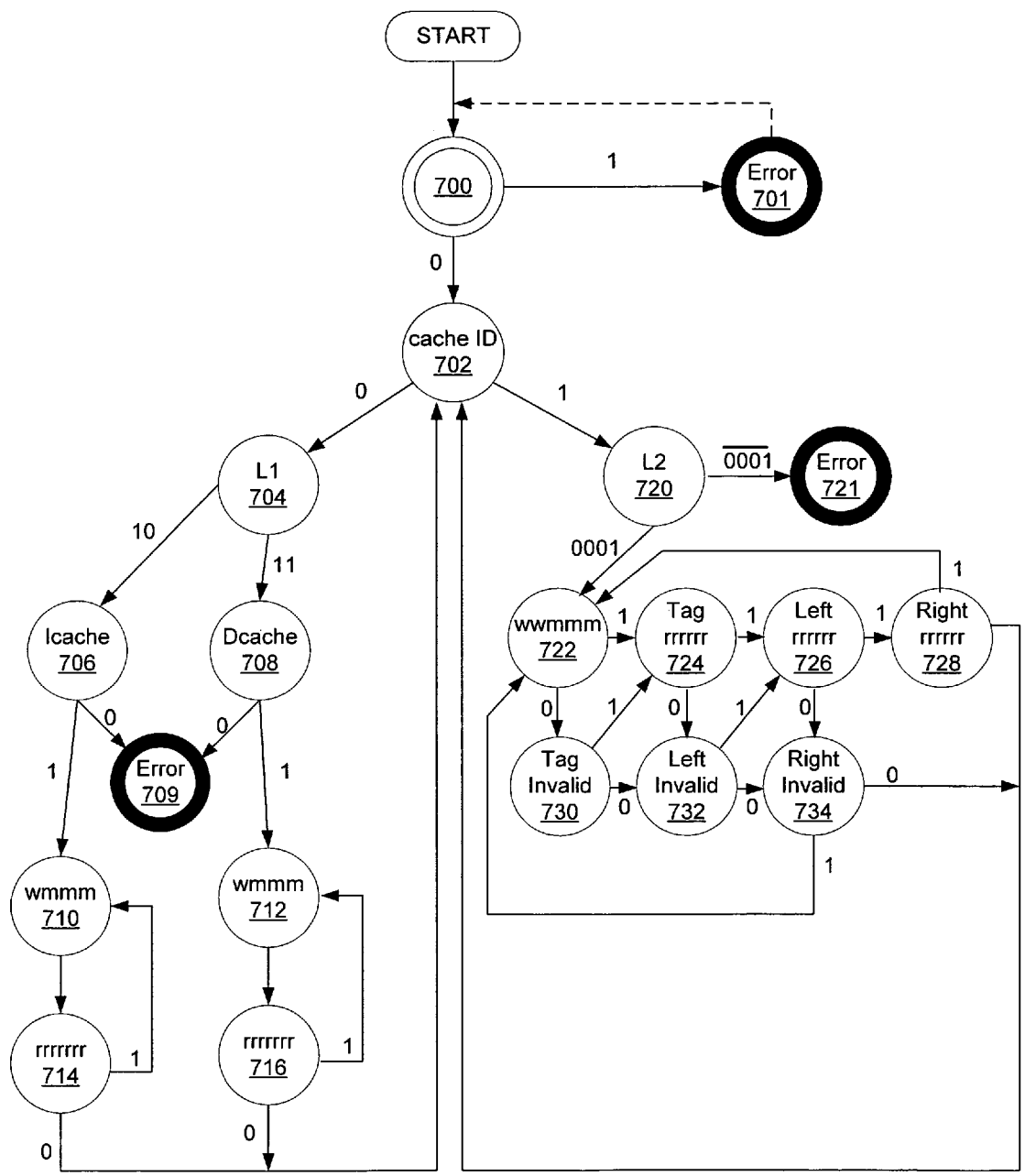
FIG. 7 depicts one embodiment of a parser.

Turning to FIG. 7, one embodiment of a portion to token parser 410 is illustrated. It is to be understood that the embodiment shown is intended to be exemplary only as numerous other embodiments are possible and are contemplated. In the example shown, the encodings depicted by Table 1 and Table 3 are assumed and a 1 MB L2 cache is assumed. Although, as already mentioned, the size of the L2 cache may be determined by parsing the bits themselves. Upon reset or some other test/repair initiating event, a state 700 is entered. Noting that in both Table 1 and Table 3, valid encodings begin with a "0" bit, an error condition 701 is detected if a "1" bit is initially detected. Upon detecting an error condition, any response deemed suitable may be undertaken. For example, the test/repair sequence may be re-initiated, a message may be provided, processing may return to a previous state (e.g., 700) which may facilitate recovery, and so on.

If a "0" bit is detected while in state 700, the parser believes a cache ID is being detected, and the cache ID state 702 is entered. If a "0" bit is received in state 702, then L1 state 704 is entered. Otherwise, if a "1" bit is received in state 702, then L2 state 720 is entered. Assuming L1 state 704 has been entered, a "10" bit sequence will cause the Icache state 706 to be entered, and a "11" bit sequence will cause the Dcache state 708 to be entered. For the sake of simplifying the discussion and the figure, multiple bit sequences are depicted in certain portions of FIG. 7. Those skilled in the art will appreciate that multiple states may be utilized to process the multiple bit sequences. A "0" followed by either a "0" or "1" bit while in the L1 state 704 results in error condition 709. Once in either the Icache state 706 or the Dcache state 708, the next bit expected is a "1" bit. If a "1" bit is not received, error state 709 is entered. As already noted, detection of an error may result in returning to a previous state. If a "1" bit is received while in state 706 or state 708, then a sequence of four bits ("wmmm") identifying a way/portion are expected in either state 710 or state 712, respectively. Following way/portion states (710, 712), a seven bit repair address ("rrrrrrr") is expected. As already discussed above, the token parser may include mechanisms to track the number of bits received. After receiving seven bits as depicted in either state 714 or 716, the parser may assume a complete repair encoding has been received.

While in particular states as depicted in FIG. 7, various control signals may be generated to facilitate the decode process. For example, while in Icache state 706, a token signal which indicates an Icache identifier has been identified (e.g., signal 627 in FIG. 6) may be generated and a corresponding capture signal (e.g., signal 629 in FIG. 6) may be generated. Similarly, when in way/portion state 710, a token signal which indicates a way/portion identifier has been identified and a corresponding capture signal may be generated. Similar signals may be generated while in a repair address state 714, or the other states, as well. In addition, following receipt of the seventh bit while in repair address state 714 or 716, the token parser may generate a capture signal which is received by SRB master 626 in FIG. 6 and causes the SRB master 626 to capture a complete repair encoding. SRB master 626 may then convey corresponding instructions to effect the indicated repair.

After a complete repair encoding has been received, the next bit received while in state 714 or state 716 indicates what hierarchical level is being addressed. In this example, the next bit received indicates whether a new cache target ID is being received or a new repair to the already identified cache is being received. If the eighth bit (the first bit following a complete repair encoding) received while in state 714 or 716 is a "0", then a new cache ID is assumed and cache ID state 702 is entered. Alternatively, if a "1" bit is the eighth bit received, then an additional repair to the currently identified cache is indicated and the way/portion state 710 or 712 is entered from either state 714 or state 716, respectively.

If L2 state 720 has been entered from cache ID state 702, a particular sequence of bits is expected. As noted above, the present example assumes a 1 MB L2 cache. Table 3 indicates that the next four bits expected are "0001". If the sequence "0001" is not received while in state 720, an error condition 721 may be detected. If the sequence "0001" is received, way/portion state 722 is entered. As shown in Table 3, following the way/portion identifier will be three repair addresses (Tag, Left, Right) which may or may not be valid. If the particular repair is valid, the first bit will be a "1" and six additional bits will follow. If the particular repair is not valid, the first and only bit will be a "0" for that repair. As may be seen in FIG. 7, leaving state 722 are both a "0" bit which leads to an invalid Tag repair state 730 and a "1" which leads to a valid Tag repair state 724. Similarly, a valid Left repair 726, invalid Left repair 732, valid Right repair 726, and invalid Right repair 734 are indicated. Once either the Right repair valid state 728 or invalid state 734 is entered, the token parse may determine a complete repair encoding has been received and appropriate token and/or capture signals may be generated as described above. If the first bit following the complete repair encoding is a "0", then it may be assumed a new target cache ID is being received and cache ID state 702 is entered. Alternatively, if the first bit following the complete repair encoding is a "1", then an additional repair to the L2 cache is assumed and way/portion state 722 is entered.

As may be appreciated from the above discussion, the hierarchical encoding method may be extended to accommodate the identification of any number of hierarchies or sub-portions. For example, Table 4 below illustrates an encoding format which uses two bits to distinguish between various levels of hierarchies. It should be noted that while the discussion herein speaks of hierarchies in the sense of greater or less detail or "granularity", the methods and mechanisms described which distinguish between various sub-portions need not be applied to strictly hierarchical subjects. For example, identified sub-portions within a hierarchical encoding scheme may be entirely disjoint.

TABLE 4

Cache Repair Encoding Format

| Cache | Cache ID | SubPortion1 | SubPortion2 | SubPortion3 |
|---|---|---|---|---|
| Cache 1 | 00 0 | 01 bbbb | 10 bbbb | bbbbbbb |
| Cache 2 | 00 1 | 01 bbbb | 10 bbbb | bbbbbbb |

In Table 4 above, a repair encoding format is depicted in which two predetermined bits are utilized to distinguish between various levels of hierarchy. In this example, a "b" represents a bit. Table 4 is similar to Table 1, with the exception that more levels of hierarchy are distinguishable. In Table 4, a Cache ID (first level of hierarchy) is preceded by the bits "00", a Subportion 1 identifier (second level of hierarchy) is preceded by the bits "01", and a Subportion2 identifier (third level of hierarchy) is preceded by the bits "10". Note that a Subportion2 identifier may alternatively be preceded by a single "1" bit as that is sufficient to distinguish it from both a Cache ID and a Subportion 1 identifier. How many levels of identifiable hierarchy a particular encoding supports may be influenced by many factors. For example, in smaller caches increasing the number of identifiable levels may not be cost effective. On the other hand, as cache sizes grow, increasing the number of identifiable levels of hierarchy may be desirable.

For example, in a cache size of one terabyte it may be advantageous to utilize an encoding which accommodates numerous logical partitions/hierarchies. Such an encoding format may allow for the encoding of a number of repairs without the need to recode numerous higher order identifying bits. In addition, it is not inconceivable that defects within a memory device may cluster in a particular error due to mask focus errors, or otherwise. Because such clustered defects may generally correspond to a particular sub-portion of the device, encoding repairs for the clustered defects may be achieved without recoding the higher levels of hierarchy for each defect.

Figure 8:
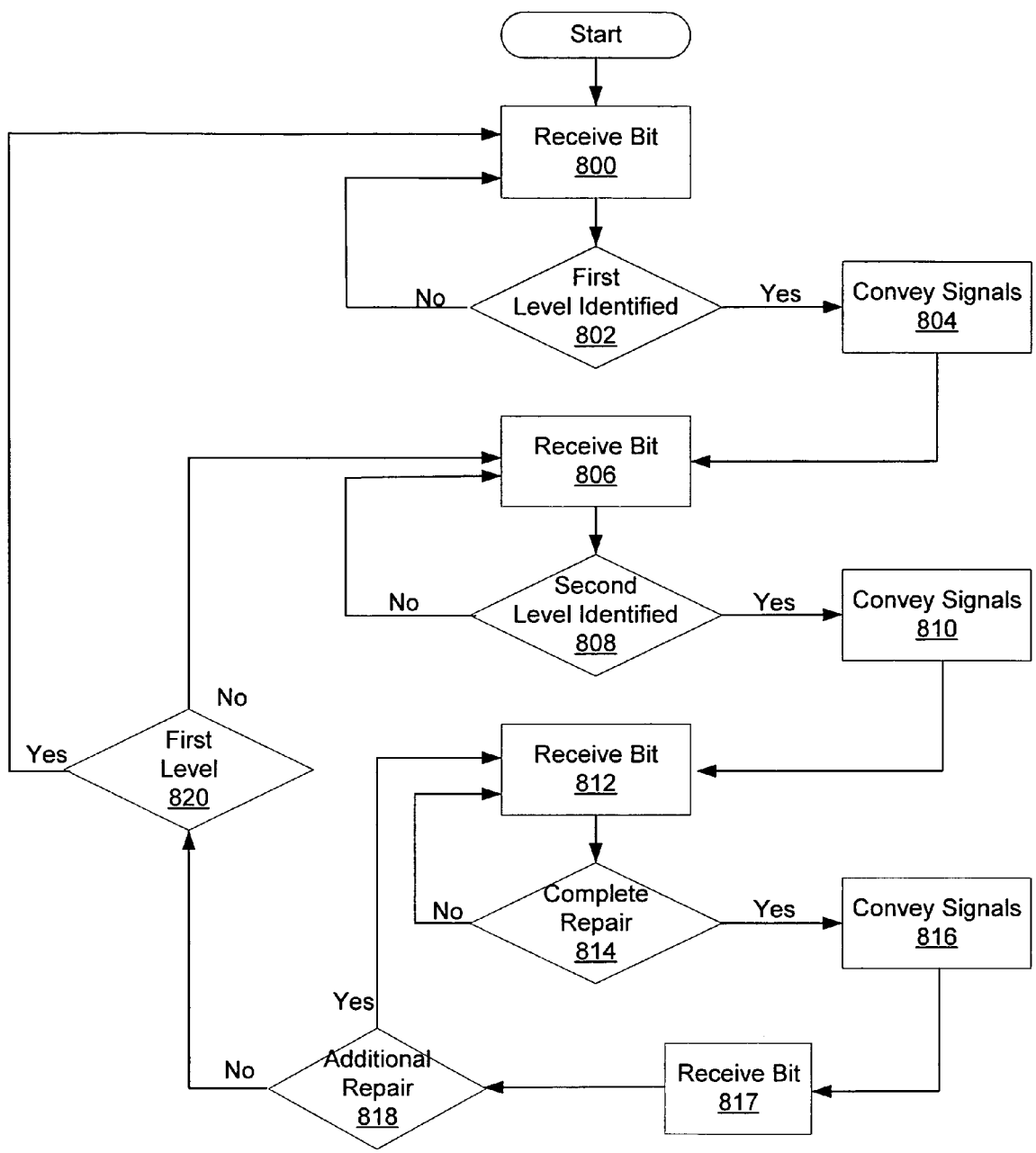
FIG. 8 depicts a parse flow diagram.

FIG. 8 provides an overview of one embodiment of a method in accordance with the above description. Generally speaking, the method depicted in FIG. 8 corresponds to the parsing of encoded bits which are received by a decompressor. Subsequent to initiating the process ("Start"), a bit of the repair encoding data is received (block 802) and a determination is made as to whether the first hierarchy of the encoding format has been identified. As already discussed, predetermined bit sequences may form identifiable tokens which identify various hierarchies. Once the first level of the hierarchy has been detected, signals may be generated (block 804) which correspond to identified hierarchy. For example, a token signal may be generated which corresponds to an L1 cache and a capture signal may be generated which causes the corresponding bit sequence to be captured.

Subsequent to, or concurrent with, the conveyance of signals (block 804), processing of the bit stream continues in blocks 806 and 808. Upon identifying the second level of the hierarchy (block 808), corresponding signals may be generated (block 810), and processing continues (blocks 812 and 814). Finally, upon detecting a complete repair encoding (block 814), corresponding signals are conveyed (block 816). For example, capture signals may be conveyed to an SRB master which then captures the repair information and generates corresponding commands to effect the indicated repairs.

Following the conveyance of the complete repair signals (block 816), a bit (or bits) of the encoded repair data may then be received (block 817). In an embodiment where multiple repairs may be encoded (e.g., as illustrated in Table 2), a determination may be made (block 818) as to whether another repair is included. For example, a valid bit may precede each potential repair to indicate whether or note the following data identifies a valid repair. If an additional repair is indicated (block 818), processing may return to block 812. On the other hand, if no further repairs are indicated, processing continues with block 820. Based upon the value of the received bit(s), a determination is made as to whether the following repair information corresponds to the first level of the hierarchy (block 820). For example, if the received bit has a value of "0", then an identifier corresponding to the first level of the hierarchy may be indicated and processing transitions to block 800 to begin receiving the first level identifier. If the received bit has a value of "1", then the currently identified first level of hierarchy is implied, the second level of the hierarchy is indicated to be the following data, and processing transitions to block 806 to begin receiving the second level identifier. Therefore, based upon the hierarchical format used for encoding repairs, encoding of multiple repairs may be compressed and various hierarchies may be implied. As may be appreciated, the method described in FIG. 8 may be expanded to include any number of hierarchies, and implied levels of hierarchy, desired.

Figure 9:
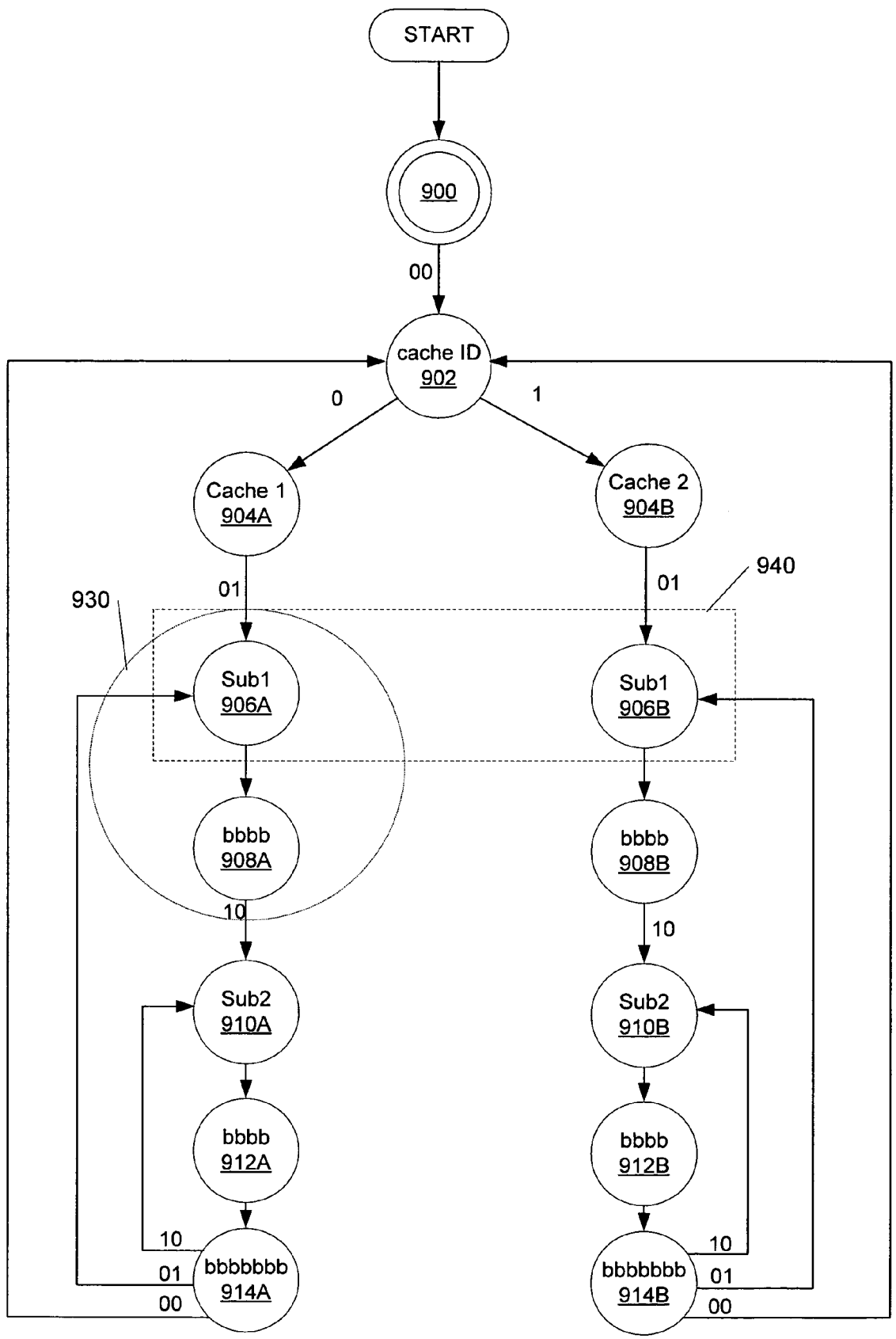
FIG. 9 depicts one embodiment of a parser.

FIG. 9 depicts one embodiment of a portion of a flow diagram for a token parser which generally corresponds to Table 4. Subsequent to initiation, state 900 is entered. While in state 900, the bit sequence "00" causes a transition to cache ID state 902. As noted in the discussion of Table 4, the bit sequence of "00" at this point in parsing indicates a cache ID follows. From cache ID state 902, a "0" bit transitions to cache 1 state 904A and a "1" bit transitions to cache 2 state 904B. Following the cache 1 state 904A transition line, a "01" transitions to Sub1 state 906A and four bits "bbbb" are received 908A. From state 908A, the sequence "10" is received and Sub2 state 910A is entered and four bits "bbbb" are received 912A. Finally, Subportion 3 bits "bbbbbbb" are received in state 914A. The transition following state 914A depends upon the next bits received. If the next two bits received are "00", the a transition to the highest level of the hierarchy, cache ID state 902 is entered where a new target cache may be identified. If the next two bits received in state 914A are "01", then a transition to the hierarchy Subportion 1 906A occurs. Finally, if the next two bits received while in state 914A are "10", then a transition to Sub2 state 910A occurs. Similar transitions occur for the corresponding states (i.e., 906B, 908B, 910B, 912B, and 914B) along the cache 2 904B line of transitions. As may be appreciated, various states may be grouped together 930 along a line of transitions. Also, as shown by box 940, state 906A could be combined with state 906B, state 908A with 908B, and so on. Numerous alternatives are possible and are contemplated.

Numerous variations and modifications will become apparent to those skilled in the art once the above disclosure is fully appreciated. It is intended that the following claims be interpreted to embrace all such variations and modifications.

What is claimed is:

1. A method comprising:

receiving repair data corresponding to a device, said repair data being useable to effect a repair of said device, said repair data comprising a plurality of bits encoded according to a first format, wherein said plurality of bits identify at least a first repair to the device followed by a second repair to the device;

detecting a first portion of the first repair corresponds to a first portion of the device;

detecting a second portion of the first repair corresponds to a second portion of the device;

detecting said second repair, wherein said second repair includes fewer bits than said first repair;

determining said second repair is implicitly targeted to said first portion of the device; and effecting a repair of the device using said repair data.

2. The method as recited in claim 1, wherein said first format comprises a hierarchical format wherein said first portion corresponds to a first level of a hierarchy, and wherein the second portion corresponds to a second level of the hierarchy.

3. The method as recited in claim 2, wherein said device comprises a processor which includes a level 1 (L1) instruction cache, an L1 data cache, and an L2 cache, and wherein said first portion indicates a repair to a cache, and wherein said second portion indicates a repair to a sub-portion of a cache.

4. The method as recited in claim 3, wherein a first bit of said second repair indicates whether the bits immediately following the first bit identify a cache of the processor or a sub-portion of a cache of the processor.

5. The method as recited in claim 4, wherein in response to receiving said first repair, the method further comprises:
generating a node address which identifies a cache to which the first repair is directed;
generating data which identifies a defective address; and
conveying said node address and said defective address.

6. The method as recited in claim 5, wherein said node address and said defective address are conveyed via a special register bus, and wherein said method further comprises:
receiving said node address at a node of a plurality of nodes;
capturing said defective address and effecting a repair to a cache which corresponds to said node, in response to determining said node address corresponds to said node.

7. The method as recited in claim 6, further comprising appending additional data to said repair data in response to detecting said a failure of said first repair to effect its intended repair, wherein said additional data identifies a repair which corrects said failure.

8. The method as recited in claim 1, wherein said determining comprises examining the bits immediately following first repair.

9. A built in self repair circuit comprising:
repair storage unit configured to store repair data encoded according to a first format, said repair data comprising a plurality of bits which identify at least a first repair to a device followed by a second repair to the device, wherein the repair data is useable to effect a repair of said device; and
a decompressor coupled to receive said repair data from the repair storage unit, wherein said decompressor is configured to:
detect a first portion of the first repair corresponds to a first portion of the device;
detect a second portion of the first repair corresponds to a second portion of the device;
detect said second repair, wherein said second repair includes fewer bits than said first repair;
determine said second repair is implicitly targeted to said first portion of the device; and
wherein the built in self repair circuit is configured to effect a repair of the device using said repair data.

10. The self repair circuit as recited in claim 9, wherein said first format comprises a hierarchical format wherein said first portion corresponds to a first level of a hierarchy, and wherein the second portion corresponds to a second level of the hierarchy.

11. The self repair circuit as recited in claim 10, wherein said device comprises a processor which includes a level 1 (L1) instruction cache, an L1 data cache, and an L2 cache, and wherein said first portion indicates a repair to a cache, and wherein said second portion indicates a repair to a sub-portion of a cache.

12. The self repair circuit as recited in claim 11, wherein a first bit of said second repair indicates whether the bits immediately following the first bit identify a cache of the processor or a sub-portion of a cache of the processor.

13. The self repair circuit as recited in claim 12, wherein in response to receiving said first repair, the self repair circuit is configured to:
generate a node address which identifies a cache to which the first repair is directed;
generate data which identifies a defective address; and
convey said node address and said defective address.

14. The self repair circuit as recited in claim 13, wherein said node address and said defective address are conveyed via a special register bus which is coupled to a plurality of nodes, wherein a node of a plurality of nodes is configured to capture said defective address and effect a repair to a cache which corresponds to said node, in response to determining said node address corresponds to said node.

15. The self repair circuit as recited in claim 10, wherein said repair storage unit is further configured to additional data following said repair data, wherein said additional data identifies a repair which corrects a failure of said first repair data to effect its intended repair.

16. The self repair circuit as recited in claim 9, wherein said decompressor is configured to determine the second repair is implicitly targeted to the first portion of the device responsive to examining the bits immediately following the first repair.

17. A processor comprising:
a core processing unit;
one or more level 1 (L1) caches;
a level 2 (L2) cache; and
a built in self repair (BISR) unit, wherein said BISR unit is configured to:
store repair data encoded according to a first format, said repair data comprising a plurality of bits which identify at least a first repair to the processor followed by a second repair to the processor, wherein the repair data is useable to effect a repair of the processor;
detect a first portion of the first repair corresponds to a first portion of the processor;
detect a second portion of the first repair corresponds to a second portion of the processor;
detect said second repair, wherein said second repair includes fewer bits than said first repair;
determine said second repair implicitly targeted to the first portion of the device; and
effect a repair of the processor using said repair data.

18. The processor as recited in claim 17, wherein said first format comprises a hierarchical format wherein said first portion corresponds to a first level of a hierarchy, and wherein the second portion corresponds to a second level of the hierarchy.

19. The processor as recited in claim 18, wherein said first portion indicates a repair to a cache within the processor, and wherein said second portion indicates a repair to a sub-portion of the cache.

20. The processor as recited in claim 19, wherein a first bit of said second repair indicates whether the bits immediately following the first bit identify a cache of the processor or a sub-portion of a cache of the processor.

21. The processor as recited in claim 20, further comprising a special register bus and a plurality of special register bus nodes coupled to the special register bus, wherein said BISR unit is coupled to the special register bus, and wherein each of the special register bus nodes corresponds to a different cache within the processor.

22. The processor as recited in claim 21, wherein the BISR is further configured to:
generate a node address which identifies a cache to which the first repair is directed;
generate data which identifies a defective address; and
convey said node address and said defective address via the special register bus.

23. The processor as recited in claim 22, wherein a node of the plurality of nodes is configured to capture said defective address and effect a repair to a cache which corresponds to said node, in response to determining said node address corresponds to said node.

24. The processor as recited in claim 23, wherein said BISR unit is further configured to store additional data following said repair data, wherein said additional data identifies a repair which corrects a failure of said first repair data to effect its intended repair.

25. The processor as recited in claim 17, wherein said BISR unit is configured to determine the second repair is implicitly targeted to said first portion of the device responsive to examining the bits immediately following the first repair.

* * * * *